US012321022B2

(12) United States Patent
Wade et al.

(10) Patent No.: US 12,321,022 B2
(45) Date of Patent: Jun. 3, 2025

(54) APPARATUS FOR OPTICAL FIBER-TO-PHOTONIC CHIP CONNECTION AND ASSOCIATED METHODS

(71) Applicant: Ayar Labs, Inc., Santa Clara, CA (US)

(72) Inventors: Mark Wade, Berkeley, CA (US); Chen Sun, Berkeley, CA (US); John Fini, Berkeley, CA (US); Roy Edward Meade, Boise, ID (US); Vladimir Stojanovic, Berkeley, CA (US); Alexandra Wright, San Francisco, CA (US)

(73) Assignee: Ayar Labs, Inc., San Jose, CA (US)

( * ) Notice: Subject to any disclaimer, the term of this patent is extended or adjusted under 35 U.S.C. 154(b) by 847 days.

(21) Appl. No.: 16/866,528

(22) Filed: May 4, 2020

(65) Prior Publication Data

US 2020/0264390 A1     Aug. 20, 2020

Related U.S. Application Data

(63) Continuation of application No. 15/902,923, filed on Feb. 22, 2018, now Pat. No. 10,641,976.

(Continued)

(51) Int. Cl.
*G02B 6/42*  (2006.01)
*G02B 6/36*  (2006.01)
*H10D 62/10* (2025.01)

(52) U.S. Cl.
CPC ........... *G02B 6/423* (2013.01); *H10D 62/115* (2025.01); *G02B 6/3636* (2013.01);
(Continued)

(58) Field of Classification Search
CPC .... G02B 6/423; G02B 6/3636; G02B 6/4214; G02B 6/4239; H01L 21/302;
(Continued)

(56) References Cited

U.S. PATENT DOCUMENTS 5,641,612 A    6/1997  Lee et al.
6,316,281 B1  11/2001  Lee et al.
(Continued)

FOREIGN PATENT DOCUMENTS

CN    202256764 U    5/2012
CN    102834754 A   12/2012

OTHER PUBLICATIONS

PCT/US18/19439, International Search Report and Written Opinion.

*Primary Examiner* — Sung H Pak
*Assistant Examiner* — Hoang Q Tran
(74) *Attorney, Agent, or Firm* — Penilla IP, APC

(57) ABSTRACT

A photonic chip includes a substrate, an electrical isolation region formed over the substrate, and a front end of line (FEOL) region formed over the electrical isolation region. The photonic chip also includes an optical coupling region. The electrical isolation region and the FEOL region and a portion of the substrate are removed within the optical coupling region. A top surface of a the substrate within the optical coupling region includes a plurality of grooves configured to receive and align a plurality of optical fibers. The grooves are formed at a vertical depth within the substrate to provide for alignment of optical cores of the plurality of optical fibers with the FEOL region when the plurality of optical fibers are positioned within the plurality of grooves within the optical coupling region.

20 Claims, 11 Drawing Sheets

Related U.S. Application Data

(60) Provisional application No. 62/462,711, filed on Feb. 23, 2017.

(52) U.S. Cl.
CPC .......... *G02B 6/4214* (2013.01); *G02B 6/4239* (2013.01); *G02B 6/4283* (2013.01)

(58) Field of Classification Search
CPC ............... H01L 21/3043; H01L 21/306; H01L 21/30604; H01L 21/3081; H01L 21/311
See application file for complete search history.

(56) References Cited

U.S. PATENT DOCUMENTS

| | | | |
|---|---|---|---|
| 6,360,043 B1 * | 3/2002 | Bostock | G02B 6/3636 385/88 |
| 6,866,426 B1 | 3/2005 | Steinberg et al. | |
| 8,139,907 B2 * | 3/2012 | Su | G02B 6/12004 385/14 |
| 8,768,122 B2 | 7/2014 | Yamaji et al. | |
| 9,274,283 B1 * | 3/2016 | Ellis-Monaghan | G02B 6/12002 |
| 9,995,881 B1 * | 6/2018 | Patel | G02B 6/4243 |
| 2004/0228580 A1 | 11/2004 | Lee et al. | |
| 2007/0274630 A1 * | 11/2007 | Ghiron | G02B 6/4231 385/33 |
| 2011/0075965 A1 * | 3/2011 | DeMeritt | G02B 6/4214 428/164 |
| 2013/0177281 A1 * | 7/2013 | Kosenko | G02B 6/4214 216/13 |
| 2016/0274318 A1 * | 9/2016 | Vallance | G02B 6/4214 |

\* cited by examiner (View A-A)

(View A-A)

(View A-A)

APPARATUS FOR OPTICAL FIBER-TO-PHOTONIC CHIP CONNECTION AND ASSOCIATED METHODS

CLAIM OF PRIORITY

This application is a continuation application under 35 U.S.C. 120 of prior U.S. application Ser. No. 15/902,923, filed Feb. 22, 2018, which claims priority under 35 U.S.C. 119(e) to U.S. Provisional Patent Application No. 62/462,711, filed Feb. 23, 2017. The disclosure of each above-identified patent application is incorporated herein by reference in its entirety for all purposes.

BACKGROUND

1. Field of the Invention

The present invention relates to optical data communication.

2. Description of the Related Art

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient mechanisms for transmitting laser light and detecting laser light at different nodes within the optical data network. In this regard, it is necessary to transmit light from an optical fiber to a photonic chip, and vice-versa. It is within this context that the present invention arises.

SUMMARY

In an example embodiment, a photonic chip is disclosed. The photonic chip includes a substrate, an electrical isolation region formed over the substrate, and a front end of line region formed over the electrical isolation region. The front end of line region includes transistors and electro-optic device. An optical coupling region is defined within a horizontal area extending inward from an edge of the photonic chip. The electrical isolation region and the front end of line region are removed within the optical coupling region. A portion of the substrate is removed within the optical coupling region. A top surface of a remainder of the substrate within the optical coupling region includes a plurality of grooves configured to receive and align a corresponding plurality of optical fibers. The plurality of grooves are formed to extend linearly across the optical coupling region from the edge of the photonic chip. The plurality of grooves are formed at a vertical depth within the substrate to provide for alignment of optical cores of the plurality of optical fibers with the front end of line region when the plurality of optical fibers are positioned within the plurality of grooves within the optical coupling region.

In an example embodiment, a photonic chip is disclosed. The photonic chip includes a substrate, an electrical isolation region formed over the substrate, and a front end of line region formed over the electrical isolation region. The front end of line region includes transistors and electro-optic devices. The photonic chip also includes an optical coupling region defined within a horizontal area extending inward from an edge of the photonic chip. A portion of the substrate is removed within the optical coupling region in a direction extending vertically through the photonic chip from a bottom surface of the substrate. A bottom surface of a remainder of the substrate within the optical coupling region includes a plurality of grooves configured to receive and align a corresponding plurality of optical fibers. The plurality of grooves are formed to extend linearly across the optical coupling region from the edge of the photonic chip. The plurality of grooves are formed to provide for alignment between optical cores of the plurality of optical fibers and corresponding vertical optical couplers within the front end of line region when the plurality of optical fibers are positioned within the plurality of grooves within the optical coupling region.

In an example embodiment, a packaged photonic chip system is disclosed. The packaged photonic chip system includes a photonic chip that includes a substrate, an electrical isolation region formed over the substrate, and a front end of line region formed over the electrical isolation region. The front end of line region includes transistors and electro-optic devices. The photonic chip includes a back end of line region formed over the front end of line region. The back end of line region includes interleved dielectric materials and metal interconnect structures. The photonic chip includes an optical coupling region defined within a horizontal area extending inward from an edge of the photonic chip. The electrical isolation region and the front end of line region and the back end of line region are removed within the optical coupling region. A portion of the substrate is removed within the optical coupling region. A top surface of a remainder of the substrate within the optical coupling region includes a plurality of grooves configured to receive and align a corresponding plurality of optical fibers. The plurality of grooves are formed to extend linearly across the optical coupling region from the edge of the photonic chip. The plurality of grooves are formed to provide for optical alignment of the plurality of optical fibers with corresponding optical couplers within the front end of line region when the plurality of optical fibers are positioned within the plurality of grooves within the optical coupling region. The packaged photonic chip system also includes a package substrate that includes electrical connection pads. The packaged photonic chip system also includes an electrical connection disposed between the photonic chip and the package substrate. The electrical connection is configured to electrically connect some of the metal interconnect structures within the back end of line region to electrical connection pads of the package substrate. At least a portion of the package substrate is removed to accommodate positioning of the plurality of optical fibers within the optical coupling region.

DETAILED DESCRIPTION

In the following description, numerous specific details are set forth in order to provide an understanding of the present invention. It will be apparent, however, to one skilled in the art that the present invention may be practiced without some or all of these specific details. In other instances, well known process operations have not been described in detail in order not to unnecessarily obscure the present invention.

In fiber-optic data communication systems, light is coupled from an optical fiber to a photonic chip, and vice-versa. Various embodiments for coupling light from the optical fiber to the photonic chip can be categorized as either endface-coupling or vertical-coupling. In the vertical-coupling embodiments, vertical grating couplers are used to couple light from the optical fiber to the photonic chip. In the endface-coupling embodiments, the optical fiber(s) and photonic chip are packaged so that the optical beam effectively travels from the optical fiber to the photonic chip and vice-versa. In some embodiments, the optical fiber(s) are aligned to spot size converters on the photonic chip. In some embodiments, the spot size converter implementation includes a top-side etch on the photonic chip to provide for suspension of one or more waveguides.

In some embodiments, an array of grooves or channels is patterned into the silicon substrate of the photonic chip to passively control alignment of an optical fiber or optical fiber array to the spot size converter(s) on the photonic chip. The optical fibers can be placed in the array of grooves or channels passively (i.e., without actively monitoring light signals through the optical fibers as they are placed in the array of grooves or channels) so that the position of the optical fibers transverse to the grooves/channels and the length direction of the optical fibers is fixed, with a final active alignment step used to adjust a single axial alignment of the optical fibers, i.e., to adjust the polarization orientation of the optical fibers. And, in some embodiments, an additional mechanical feature may be provided on the optical fibers and/or the substrate to properly orient the optical fibers at the correct axial alignment, thereby allowing passive axial alignment of the optical fibers.

Figure 1:
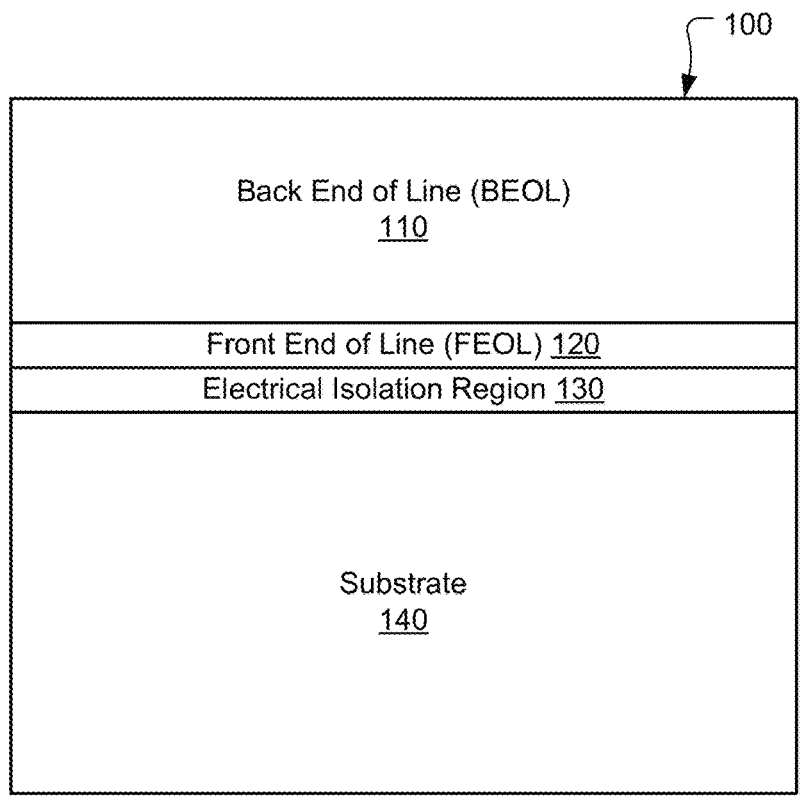
FIG. 1 shows an example photonic chip cross-section, in accordance with some embodiments.

FIG. 1 shows an example photonic chip cross-section 100, in accordance with some embodiments. It should be understood that the photonic chip cross-section 100 is not to scale. The cross-section 100 includes a Back End of Line (BEOL) region 110, which includes InterLevel Dielectric (ILD), metal interconnect, and silicon nitride passivation of the SOI die, among other features. The BEOL region 110 can optionally contain a polyimide protective layer as well. The cross-section 100 also includes a Front End of Line (FEOL) region 120, which includes various electrical devices, such as transistors, resistors, capacitors, among others. The FEOL region 120 also includes various optical devices, such as electro-optic modulators, photodetectors, optical couplers, optical waveguides, optical spot size converters, among others. The cross-section 100 also includes an electrical isolation region 130 that separates the FEOL region 120 from the wafer substrate 140. In some embodiments where the photonic chip is a silicon-on-insulator (SOI) die, the electrical isolation region 130 is a Buried Oxide (BOx) region. In some embodiments where the photonic chip is a bulk CMOS die, the electrical isolation region 130 includes Shallow Trench Isolation (STI) regions or a combination of STI regions and Deep Trench Isolation (DTI) regions. It should be understood that in various embodiments the photonic chip corresponding to the cross-section 100 can be implemented within a SOI wafer or a CMOS wafer, or another type of semiconductor wafer.

Figure 2:
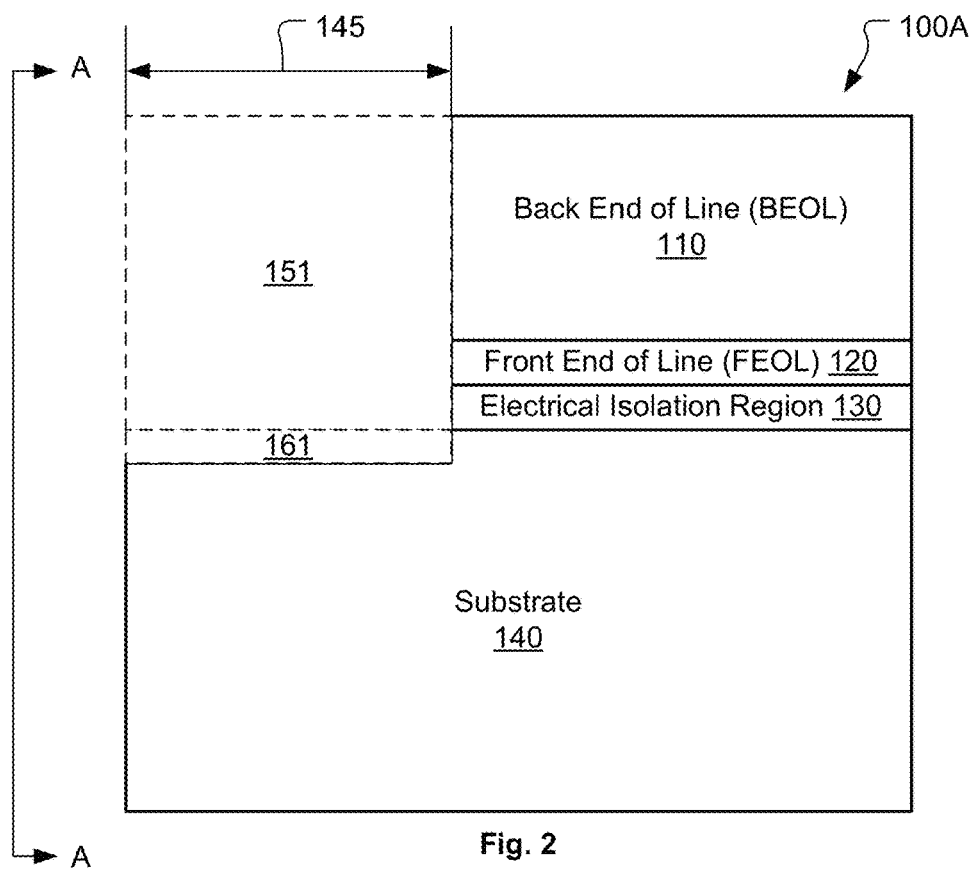
FIG. 2 shows a photonic chip cross-section that is a modification of the photonic chip cross-section of FIG. 1 to support optical coupling to the photonic chip, in accordance with some embodiments.

FIG. 2 shows a photonic chip cross-section 100A that is a modification of the photonic chip cross-section 100 to support optical coupling to the photonic chip, in accordance with some embodiments. It should be understood that the photonic chip cross-section 100A is not to scale. The photonic chip cross-section 100A includes an optical coupling region 145 defined within a horizontal area extending inward from an edge of the photonic chip. The photonic chip cross-section 100A shows a region 151 where a portion of the BEOL region 110, a portion of the FEOL region 120, and a portion of the electrical isolation region 130 have been removed within the optical coupling region 145 in preparation for optical coupling, i.e., for coupling of optical fibers to the photonic chip. The photonic chip cross-section 100A also shows a region 161 where a portion of the of the substrate 140 has been removed within the optical coupling region 145 to support placement of optical fibers. In some embodiments, the portion of the substrate 140 is removed in the region 161 in a manner that forms grooves, such as V-grooves, in the substrate 140 to facilitate placement of optical fibers. In various embodiments, the processing to remove material in regions 151 and 161 can be done at wafer scale (when the wafer is still intact) or at die scale (after the photonic chip has been singulated from the wafer). The regions 151 and 161 are formed to have a thickness such that an optical fiber core will be mostly aligned with the FEOL region 120 when the optical fiber is placed in the region 161. The photonic chip having the cross-section 100A is configured to have a floorplan that provides for removal of the materials in the regions 151 and 161 without perturbing optical and electrical performance of devices and systems within the photonic chip, particularly in the areas of photonic chip neighboring the regions 151 and 161.

Figure 3:
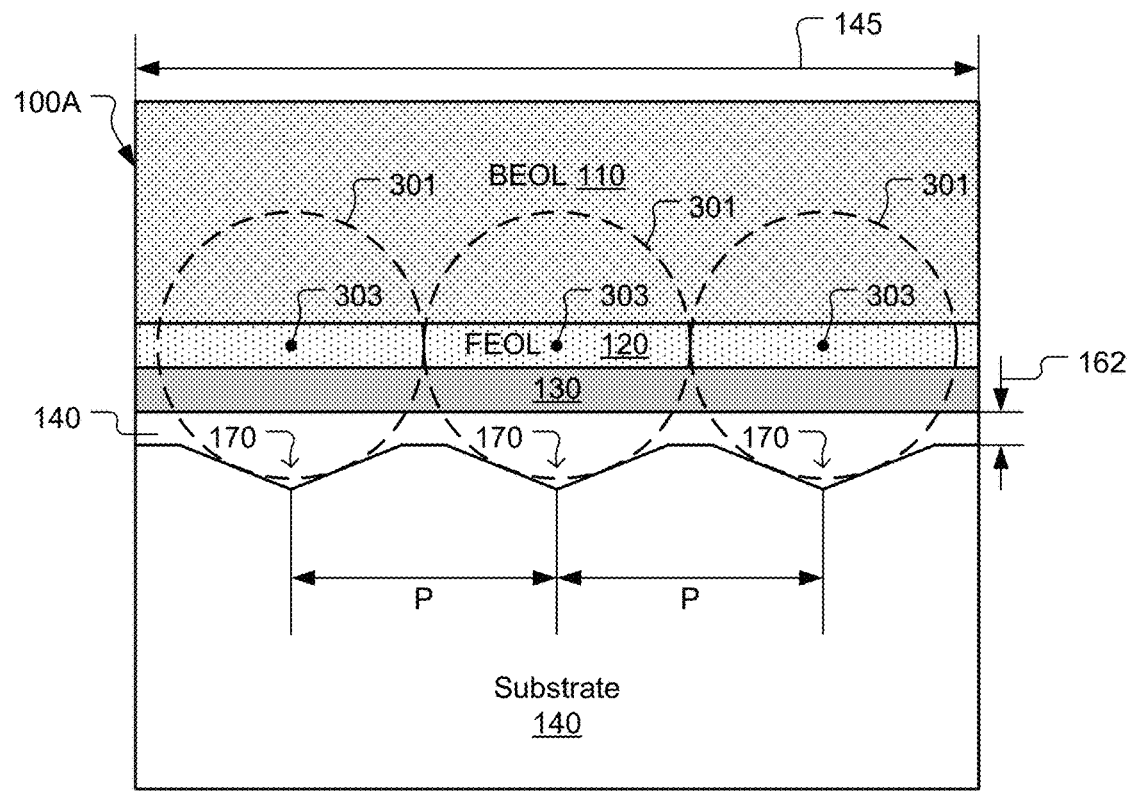
FIG. 3 shows the photon chip cross-section corresponding to the View A-A as referenced in FIG. 2, in accordance with some embodiments.

FIG. 3 shows the photon chip cross-section 100A corresponding to the View A-A as referenced in FIG. 2, in accordance with some embodiments. As shown in FIG. 3, V-grooves 170 are formed in the substrate 140 to accommodate placement of optical fibers 301. Each V-groove 170 is a recessed region that is used for placement of an optical fiber 301, with an outer surface of the optical fiber 301 laying within the V-groove 170. The V-grooves 170 are formed at a vertical depth 162 within the substrate 140 to provide for alignment of the center 303 of the optical fibers 301, i.e., of the cores of the optical fibers 301, with the FEOL region 120, when the optical fibers 301 are positioned to lay within the V-grooves 170. In various embodiments, the photonic chip can have any number of V-grooves 170 as needed. In some embodiments, a given photonic chip has one V-groove 170. In some embodiments, the number of V-grooves 170 in a given photonic chip is within a range from 2 to 200. In some embodiments, the number of V-grooves 170 in a given photonic chip is within a range from 3 to 24. FIG. 3 also shows that the V-grooves 170 can be formed to have a fixed center-to-center distance (P), i.e., groove pitch (P), as measured horizontally between adjacent V-grooves 170. In other words, the groove pitch (P) is measured perpendicularly within a horizontal plane between centerlines of adjacent V-grooves 170. The groove pitch P is defined to compactly fit the outer diameter of optical fiber 301 cladding. For example, in some embodiments, the cladding outer diameter of a single-mode optical fiber 301 is about 125 micrometers, and the groove pitch P of the V-grooves 170 is greater than 125 micrometers. In some embodiments, the groove pitch P is either 127 micrometers or 250 micrometers to accommodate some available standard packaging components and tooling. In some embodiments, the groove pitch P is greater than about 100 micrometers. However, it should be understood that in other embodiments, the groove pitch P can be set at essentially any value that accommodates positioning of the optical fibers 301 within the V-grooves 170.

In some embodiments, the optical waveguides that are formed in the FEOL region 120 need to be optically isolated from their surrounding dielectric environment, such as from the silicon substrate 140. This can be done to either increase the device performance, such as with respect to thermal tuning efficiency, modal conversion, vertical grating couplers, etc., or can be done to support bound optical modes in photonic chips where the electrical isolation region 130 is defined as a thin-BOx region. For example, in some embodiments, the electrical isolation region 130 can be defined as a thin-BOx region having a vertical thickness of less than about 1 micrometer, which may not be enough vertical distance to optically isolate waveguides in the FEOL region 120 from the silicon substrate 140.

Figure 4:
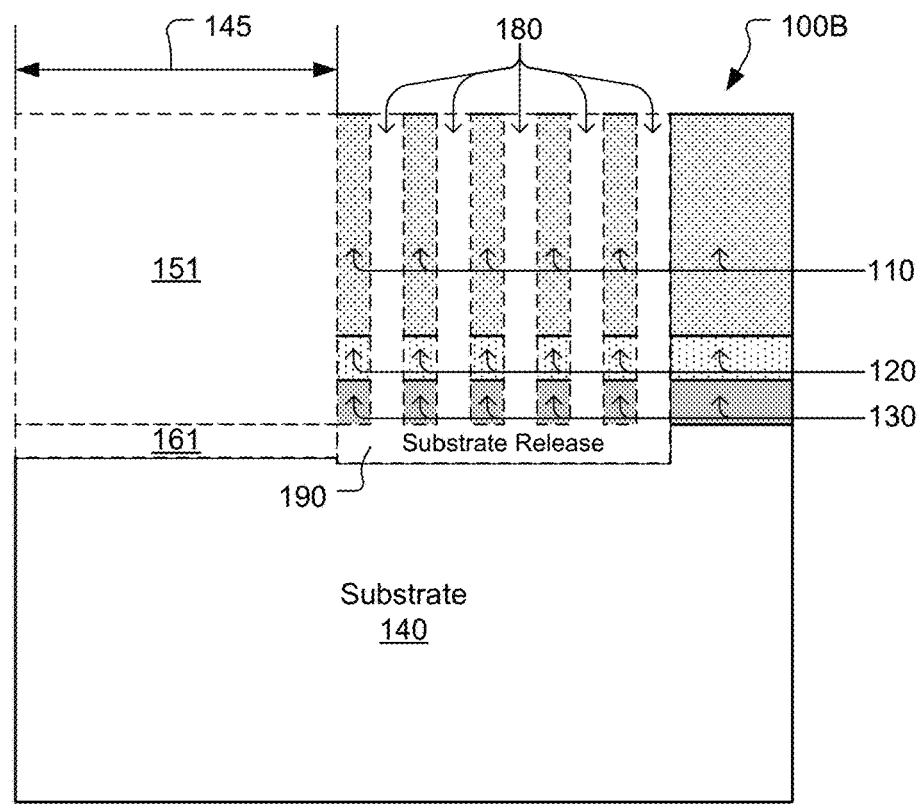
FIG. 4 shows a photonic chip cross-section that is a modification of the photonic chip cross-section of FIG. 2 to provide for optical isolation of optical devices in the FEOL region from the substrate, in accordance with some embodiments.

FIG. 4 shows a photonic chip cross-section 100B that is a modification of the photonic chip cross-section 100A to provide for optical isolation of optical devices in the FEOL region 120 from the substrate 140, in accordance with some embodiments. It should be understood that the photonic chip cross-section 100B is not to scale. In the example of FIG. 4, a plurality of holes 180 are formed, e.g., etched, through the BEOL region 110 and through the FEOL region 120 and through the electrical isolation region 130 and through some of the substrate 140 to form a locally released region 190 within the substrate 140 near the bottoms of the plurality of holes 180. The locally released region corresponds to a volume in which material of the substrate 140 is removed to provide optical isolation for one or more optical structures/devices within the FEOL region 120. In some embodiments, the locally released region 190 within the substrate 140 provides localized optical isolation for specific optical structures/devices within the FEOL region 120. FIG. 4 shows an isolated removal of the substrate 140 in the locally released region 190. However, it should be understood that portions of the BEOL region 110 and the FEOL region 120 can also be removed if needed to provide for optical isolation of optical structures/devices within the FEOL region 120. In some embodiments, the plurality of holes 180 and the locally released region 190 are left empty so as to be filled with air. In some embodiments, the plurality of holes 180 and the locally released region 190 are backfilled with an optical isolating material. In various embodiments, this optical isolating material can be one or more of air, silicon dioxide, polymethyl methacrylate (PMMA), SU-8 photoresist, silicon nitride, vacuum, benzocyclobutene (BCB), and dielectric material, among others. It should be understood that the photonic chip cross-section 100B of FIG. 4 corresponds to a vertical plane through the photonic chip where optical structures/devices are positioned. Also, it should be understood that a vertical cross-section through the photonic chip where optical structures/devices are not positioned may not have the plurality of holes 180 and the locally released region 190 within the substrate 140.

Figure 5:
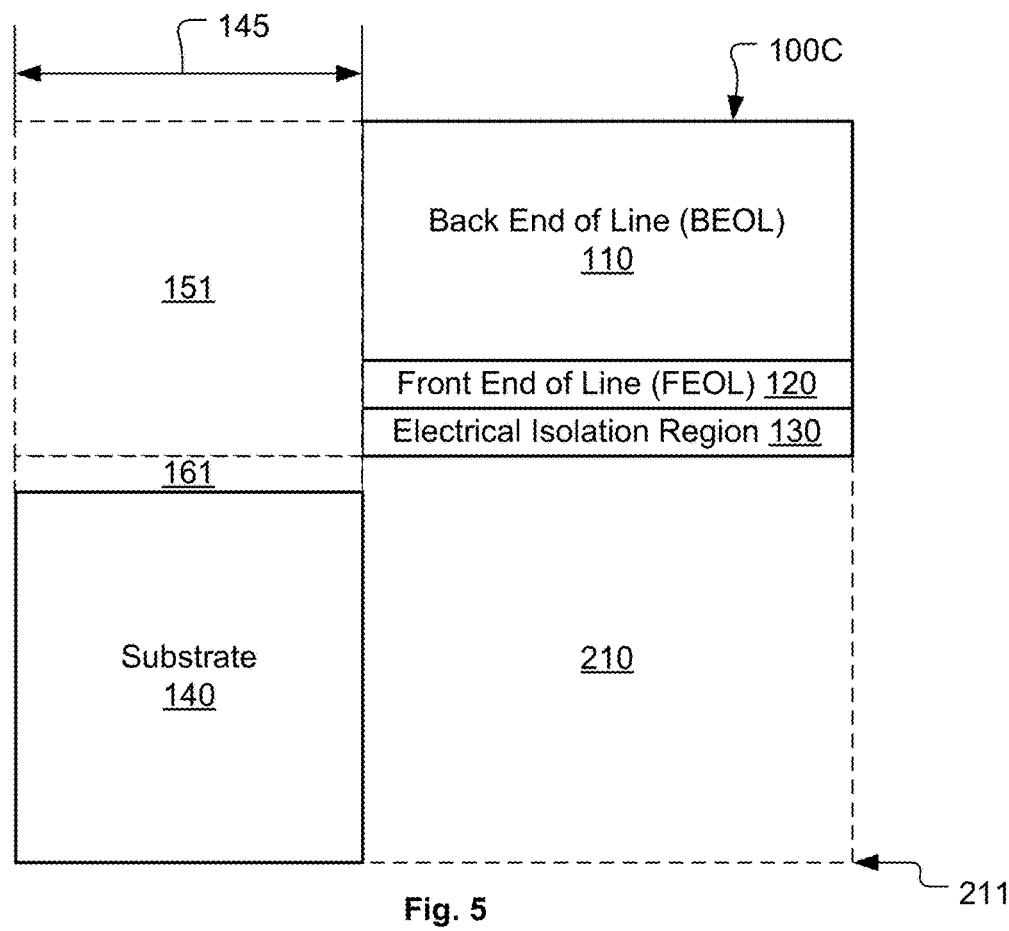
FIG. 5 shows a photonic chip cross-section that is a modification of the photonic chip cross-section of FIG. 2 to provide for optical isolation of optical devices in the FEOL region from the substrate, in accordance with some embodiments.

FIG. 5 shows a photonic chip cross-section 100C that is a modification of the photonic chip cross-section 100A to provide for optical isolation of optical devices in the FEOL region 120 from the substrate 140, in accordance with some embodiments. It should be understood that the photonic chip cross-section 100C is not to scale. FIG. 5 shows a locally released region 210 within the substrate 140 in which material of the substrate 140 is removed to provide optical isolation for one or more optical structures/devices within the FEOL region 120. The substrate 140 is removed within the locally released region 210 through a vertical extent of the photonic chip extending from a bottom surface 211 of the substrate 140 to the electrical isolation region 130, from the backside of the photonic chip. In some embodiments, the locally released region 210 of the substrate 140 is removed by performing a backside etching process on the photonic chip. In comparing the approaches depicted in FIGS. 4 and 5 for optical isolation of optical structures/devices in the FEOL region 120, it should be appreciated that the approach of FIG. 5 may include fewer manufacturing process steps and does not include interaction with the FEOL region 120 or the BEOL region 110. And, in contrast to the approach of FIG. 5, in the approach of FIG. 4, consideration of the plurality of holes 180 is required when placing devices in the FEOL region 120 and when performing interconnect conductor routing and conductor pad placement within the BEOL region 110.

It should be understood that the photonic chip cross-section 100C of FIG. 5 corresponds to regions of the photonic chip where removal of the substrate 140 is needed to provide for optical isolation of optical structures/devices within the FEOL region 120. In other regions of the photonic chip where removal of the substrate 140 is not needed for optical isolation purposes, the photonic chip cross-section includes the substrate 140 in an intact form, as well as the electrical isolation region 130, the FEOL region 120, and the BEOL region 110 in their respective intact forms.

Figure 6:
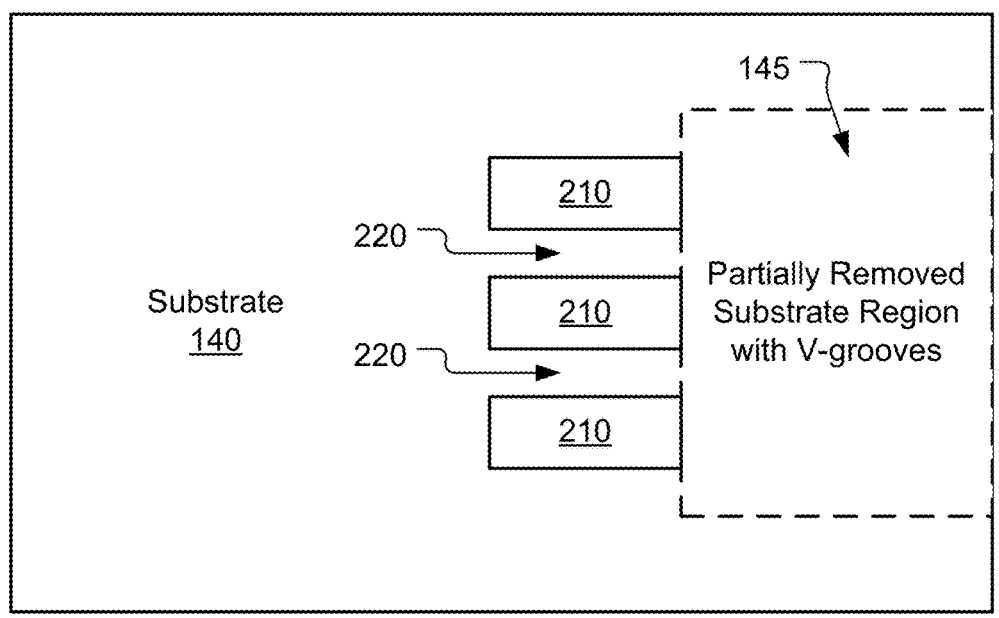
FIG. 6 shows an example backside view of the photonic chip after processing to form multiple side-by-side positioned locally released regions through the substrate in accordance with the approach depicted in FIG. 5, in accordance with some embodiments.

FIG. 6 shows an example backside view of the photonic chip after processing to form multiple side-by-side positioned locally released regions 210 through the substrate 140 in accordance with the approach depicted in FIG. 5, in accordance with some embodiments. It should be understood that the photonic chip view of FIG. 6 is not to scale. In FIG. 6, the locally released regions 210 provide optical isolation beneath the FEOL region 120 for optical structures/devices formed within the FEOL region 120. As discussed with regard to FIGS. 2 and 3, the partially removed substrate 140 region within the optical coupling region 145 includes alignment features for placing the optical fibers 301, such as the V-grooves 170 described with regard to FIG. 3. It should be understood that the locally released regions 210 are formed within the substrate 140 at locations required for optical isolation of the optical structures/devices within the FEOL region 120. In some embodiments, the partially removed area of the substrate 140 within the optical coupling region 145 can extend to the locally released regions 210 of the substrate 140, while enabling proper placement of the optical fibers 301 within the V-grooves within the partially removed area of the substrate 140 within the optical coupling region 145. Also, in some embodiments, side-by-side positioned locally released regions 210 within the substrate 140 are separated from each other by a portion 220 of the substrate 140 configured to preserve mechanical integrity of the photonic chip. In some embodiments, the portion 220 of the substrate 140 extends through a full vertical extent of an initial configuration of the substrate 140 prior to formation of the optical coupling region 145.

In accordance with the foregoing, in some embodiments, a photonic chip includes the substrate 140, the electrical isolation region 130 formed over the substrate 140, and the FEOL region 120 formed over the electrical isolation region 130. The FEOL region 120 includes transistors and electro-optic devices, among other electrical device and optical structures/devices. In some embodiments, the electrical isolation region is a buried oxide region. In some embodiments, the electrical isolation region includes one or more of a shallow trench isolation region and a deep trench isolation region. The optical coupling region 145 is defined within a horizontal area extending inward from an edge of the photonic chip. The electrical isolation region 130 and the front end of line region 120 are removed within the optical coupling region 145. A portion of the substrate 140 is removed within the optical coupling region 145. A top surface of a remainder of the substrate 140 within the optical coupling region 145 includes a plurality of grooves 170 configured to receive and align a corresponding plurality of optical fibers 301. The plurality of grooves 170 are formed to extend linearly across the optical coupling region 145 from the edge of the photonic chip. The plurality of grooves 170 are formed at the vertical depth 162 within the substrate 140 to provide for alignment of optical cores, i.e., centers 303, of the plurality of optical fibers 301 with the FEOL region 120 when the plurality of optical fibers 301 are positioned within the plurality of grooves 170 within the optical coupling region 145.

In some embodiments, the plurality of grooves 170 has a number of grooves within a range from 2 to 200. In some embodiments, the plurality of grooves 170 has a number of grooves within a range extending from 3 to 24. In some embodiments, the plurality of grooves 170 are formed in accordance with the groove pitch (P), where the groove pitch (P) is measured perpendicularly within a horizontal plane between centerlines of adjacent grooves 170. In some embodiments, the groove pitch (P) is greater than or equal to a outer diameter of each optical fiber 301 within the plurality of optical fibers 301. In some embodiments, the groove pitch (P) is greater than about 125 micrometers. In some embodiments, the groove pitch (P) is about 127 micrometers or about 250 micrometers.

The photonic chip also includes the BEOL region 110 formed over the FEOL region 120. The BEOL region 110 includes interlevel dielectric materials and metal interconnect structures, among other structures. The BEOL region 110 is removed within the optical coupling region 145 to accommodate positioning of the plurality of optical fibers 301 within the optical coupling region 145. In some embodiments, the plurality of holes 180 are formed to extend through the BEOL region 110 and through the FEOL region 120 and through the electrical isolation region 130 and through some of the substrate 140. Also, the locally released region 190 is formed within the substrate 140 near bottoms of the plurality of holes 180, where the locally released region 190 corresponds to a volume in which material of the substrate 140 is removed to provide optical isolation for one or more optical structures within the FEOL region 120. In some embodiments, the plurality of holes 180 and the locally released region 190 within the substrate 140 are backfilled with an optical isolating material. In various embodiments, the optical isolating material is one or more of air, silicon dioxide, polymethyl methacrylate (PMMA), SU-8 photoresist, silicon nitride, vacuum, benzocyclobutene (BCB), and dielectric material, among others.

In some embodiments, the at least one locally released region 210 is formed within the substrate 140. Material of the substrate 140 is removed within the at least one locally released region 210 to provide optical isolation for one or more optical structures within the FEOL region 120. More specifically, the substrate 140 is removed within the at least one locally released region 210 through a vertical extent of the photonic chip extending from the bottom surface of the substrate 211 to the electrical isolation region 130. In some embodiments, each of the at least one locally released region 210 within the substrate 140 is backfilled with an optical isolating material. In various embodiments, the optical isolating material is one or more of air, silicon dioxide, polymethyl methacrylate (PMMA), SU-8 photoresist, silicon nitride, vacuum, benzocyclobutene (BCB), and dielectric material, among others. In some embodiments, the at least one locally released region 210 within the substrate 140 is formed next to the remainder of the substrate 140 within the optical coupling region 145. In some embodiments, the at least one locally released region 210 within the substrate 140 includes at least two side-by-side positioned locally released regions 210 separated from each other by a portion 220 of the substrate 140 configured to preserve mechanical integrity of the photonic chip.

Figure 7:
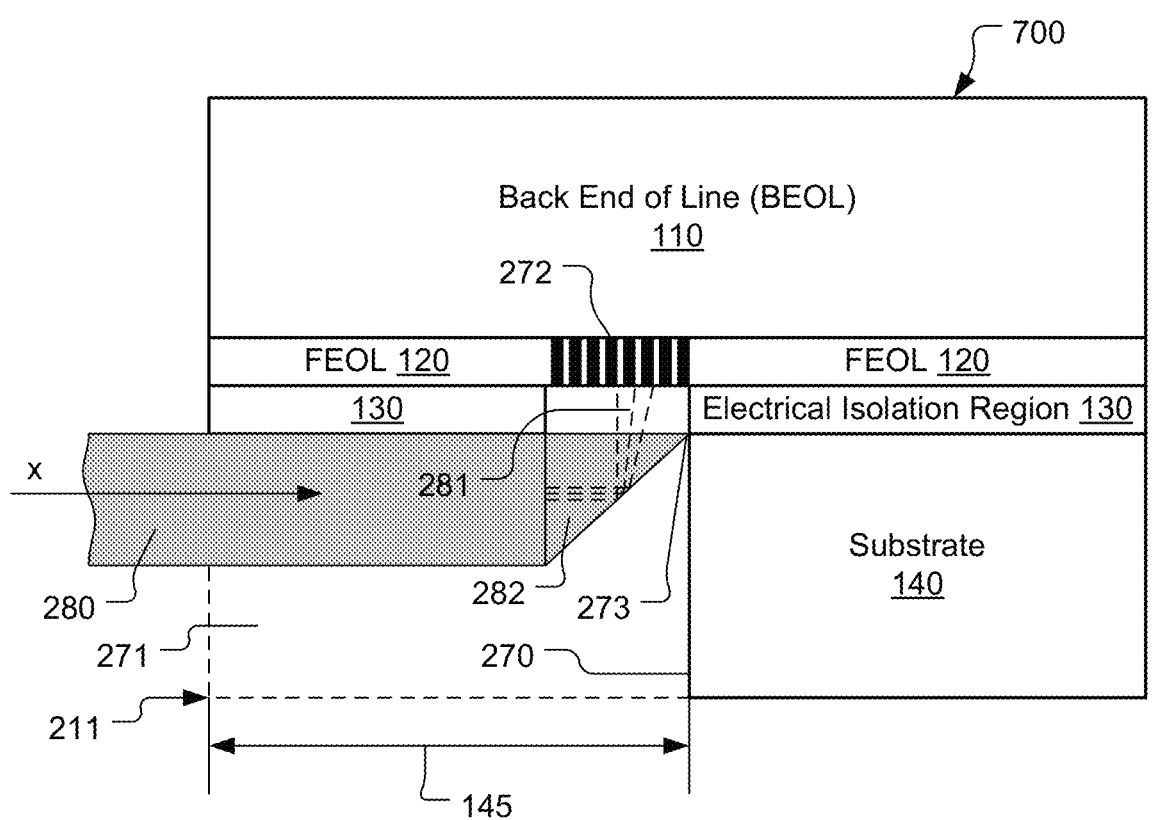
FIG. 7 shows a photonic chip cross-section in which a region of the substrate is removed to allow for placement of an optical fiber to couple light into out-of-plane/vertical couplers through the substrate side of the photonic chip, in accordance with some embodiments.

FIG. 7 shows a photonic chip cross-section 700 in which a region 271 of the substrate 140 is removed to allow for placement of an optical fiber 280 to couple light 281 into out-of-plane/vertical couplers 272 through the substrate 140 side of the photonic chip, in accordance with some embodiments. In some embodiments, the optical fiber 280 is terminated by an optical turning mechanism 282 configured to turn light 281 emitted from a core of the optical fiber 280 into the out-of-plane/vertical couplers 272 within the FEOL region 120. In some embodiments, the region 271 of the substrate 140 is removed by performing a backside etching process on the substrate 140. The remaining substrate 140 provides a stop barrier 270 for positioning a tip 273 of the optical fiber 280. Given that optical access to the photonic chip can be achieved with the out-of-plane couplers 272, i.e., surface-normal couplers, through the substrate-facing direction, V-grooves and/or other alignment structures can be formed when removing the substrate 140 within the region 271 to achieve self-alignment between the photonic chip and the placed optical fiber(s) 280, where the V-grooves and/or other alignment structures are used to guide the position(s) of the optical fiber(s) 280. For example, FIG. 7 shows that when the optical fiber 280 is inserted in a horizontal direction x, the tip 273 of the optical fiber 280 is stopped at a point where it contacts the stop barrier 270 formed by the remaining substrate 140.

Figure 8A:
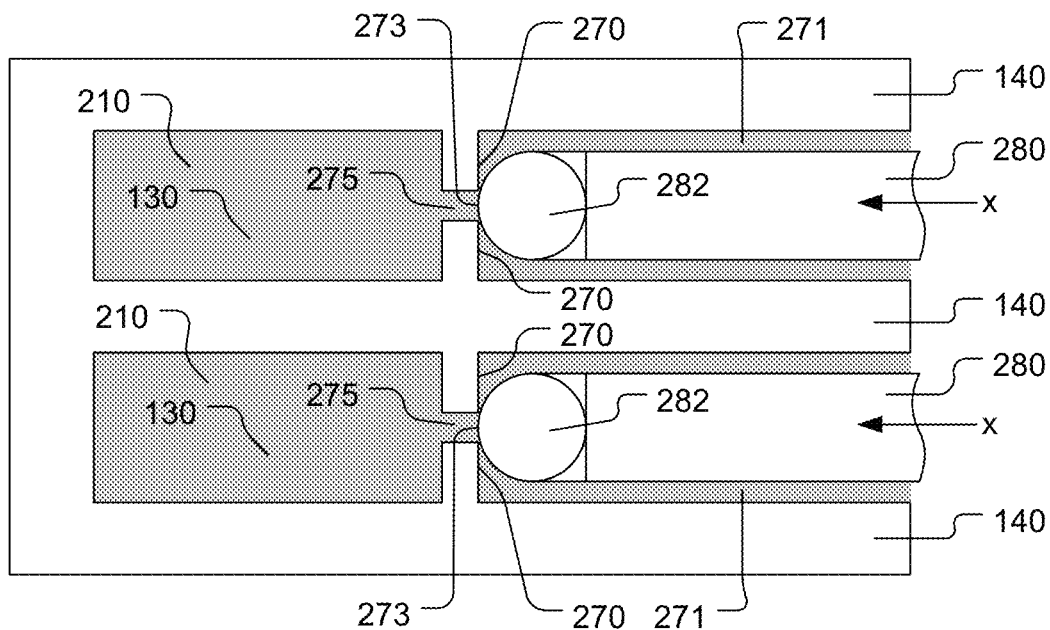
FIGS. 8A and 8B show backside views of example substrate etching patterns that can be used for removal of portions of the substrate within the regions to accommodate placement of the optical fibers, and for removal of portions of the substrate within locally released regions located below optical structures/device within the FEOL region, in accordance with some embodiments.
Figure 8B:
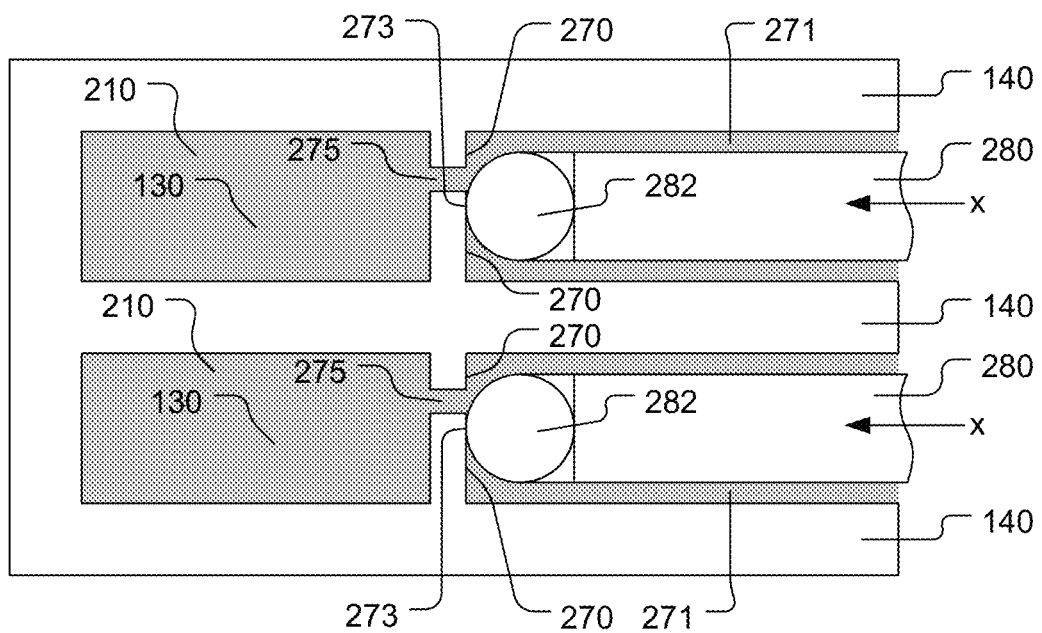

FIGS. 8A and 8B show backside views of example substrate 140 etching patterns that can be used for removal of portions of the substrate 140 within the regions 271 to accommodate placement of the optical fibers 280, and for removal of portions of the substrate 140 within locally released regions 210 located below optical structures/device within the FEOL region 120, in accordance with some embodiments. The example substrate 140 etching patterns show portions of the electrical isolation region 130 exposed in the locally released regions 210 where portions of the substrate 140 have been completely removed. The substrate etching pattern also shows the regions 271 formed within the substrate 140 to provide for self-alignment of the optical fibers 280 to the photonic chip structure. The example substrate 140 etching patterns also include regions 275 where the substrate 140 is removed to form inlets 275 through which an optical waveguide can be positioned/formed. Each inlet 275 is sized smaller than the width/diameter of the optical fiber 280, but large enough to allow for positioning of the optical waveguide through the inlet 275. Each inlet 275 is aligned to a respective region 271 to enable self-alignment of the optical fiber 280 to the inlet 275 in both the horizontal and vertical directions. The remaining substrate 140 adjacent to the inlet 275 functions as the stop barrier 270 for the optical fiber 280 when the optical fiber 280 is inserted in the horizontal direction x. This configuration allows a fully inserted resting position of the optical fiber 280 to be set by the position of the substrate 140 wall adjacent to the inlet 275, i.e., by the position of an entrance to the inlet 275 when approaching the inlet 275 from the optical fiber 280 side.

In some embodiments, the optical fiber 280 is inserted so that the tip 273 of the optical fiber 280 touches the substrate 140 wall adjacent to the inlet 275, which allows for self-alignment of the optical fiber 280 in the horizontal direction x. If the inlet 275 is wide enough that the rounded tip 273 of the optical fiber 280 creates uncertainty in the final stopping position of the optical fiber 280 in the horizontal direction x, the inlet 275 can be positioned slightly off-center from the V-groove 170 formed within the region 271, as shown in FIG. 8B, to ensure that the tip 273 of the optical fiber 280 touches the substrate 140 wall adjacent to the inlet 275, as opposed to allowing the tip 273 of the optical fiber 280 to protrude into the inlet 275. It should be understood that the example substrate etching patterns of FIGS. 8A and 8B can be extended to include more than two regions 271 (with respective V-grooves 170) and more than two inlets 275 for positioning of multiple optical fibers 280.

In accordance with the foregoing, in some embodiments, a photonic chip includes the substrate 140, the electrical isolation region 130 formed over the substrate 140, and the FEOL region 120 formed over the electrical isolation region 130. The FEOL region 120 includes transistors and electro-optic devices, among other electrical device and optical structures/devices. In some embodiments, the electrical isolation region is a buried oxide region. In some embodiments, the electrical isolation region includes one or more of a shallow trench isolation region and a deep trench isolation region. The photonic chip also includes the optical coupling region 145 defined within a horizontal area extending inward from an edge of the photonic chip. A portion of the substrate 140 is removed within the optical coupling region 145 in a direction extending vertically through the photonic chip from the bottom surface 211 of the substrate 140. In some embodiments, a bottom surface of a remainder of the substrate 140 within the optical coupling region 145 includes a plurality of grooves configured to receive and align a corresponding plurality of optical fibers 280. The plurality of grooves are formed to extend linearly across the optical coupling region 145 from the edge of the photonic chip. The plurality of grooves are formed to provide for alignment between optical cores of the plurality of optical fibers 208 and corresponding vertical optical couplers 272 within the FEOL region 120 when the plurality of optical fibers 280 are positioned within the plurality of grooves within the optical coupling region 145. In some embodiments, each optical fiber 280 in the plurality of optical fibers 280 is terminated by an optical turning mechanism 282 configured to turn light emitted from a core of the optical fiber 280 into a corresponding vertical optical coupler 272 within the FEOL region 120.

In some embodiments, a downward protruding portion of the substrate 140 located at an inner edge of the optical coupling region 145 provides the stop barrier 270 for the plurality of optical fibers 280. The stop barrier 270 is configured to direct proper positioning of the plurality of optical fibers 280 when the plurality of optical fibers 280 are positioned within the plurality of grooves to contact the stop barrier 270. In some embodiments, a waveguide extends through an inlet 275 formed through the downward protruding portion of the substrate 140 located at the inner edge of the optical coupling region 145, the waveguide is configured to be in optical communication with a given optical fiber 280 of the plurality of optical fibers 280. In some embodiments, the waveguide is formed in substantial alignment with a given groove of the plurality of grooves within which the given optical fiber 280 is positioned.

In some embodiments, the waveguide is formed at a location offset from a given groove of the plurality of grooves within which the given optical fiber 280 is positioned.

In some embodiments, the photonic chip can include at least one locally released region 210 within the substrate 140 in which material of the substrate 140 is removed to provide optical isolation for one or more optical structures/devices within the FEOL region 120, where the substrate 140 is removed within the at least one locally released region 210 through a vertical extent of the photonic chip extending from the bottom surface 211 of the substrate 140 to the electrical isolation region 130.

In some embodiments, each of the at least one locally released region 210 within the substrate 140 is backfilled with an optical isolating material. In some embodiments, the optical isolating material is one or more of air, silicon dioxide, polymethyl methacrylate (PMMA), SU-8 photoresist, silicon nitride, vacuum, benzocyclobutene (BCB), and dielectric material, among others. In some embodiments, the downward protruding portion of the substrate 140 that provides the stop barrier 270 is positioned between the at least one locally released region 210 within the substrate 140 and the remainder of the substrate 140 within the optical coupling region 145. In some embodiments, the at least one locally released region 210 within the substrate 140 includes at least two side-by-side positioned locally released regions 210 separated from each other by a portion of the substrate 140 configured to preserve mechanical integrity of the photonic chip and that is connected to the downward protruding portion of the substrate 140 that provides the stop barrier 270.

Figure 9A:
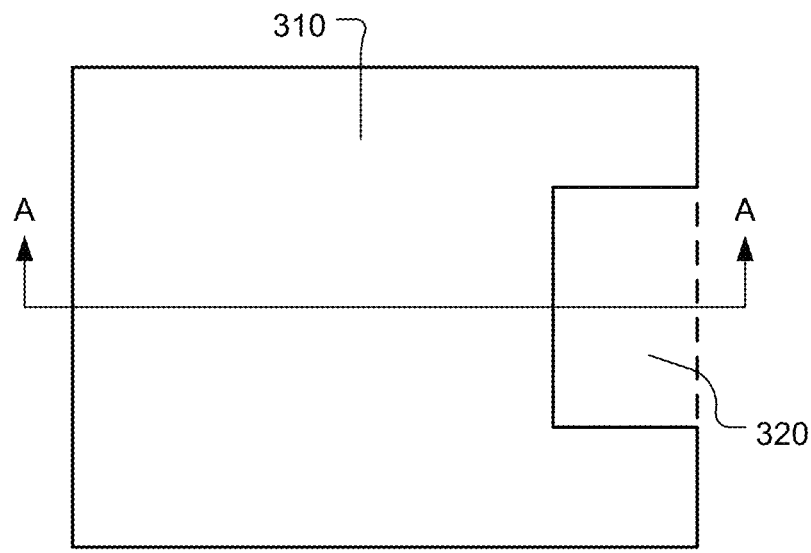
FIG. 9A shows a top view of a package substrate that can simultaneously support optical packaging and flip-chip electrical packaging, in accordance with some embodiments.

FIG. 9A shows a top view of a package substrate 310 that can simultaneously support optical packaging and flip-chip electrical packaging, in accordance with some embodiments. A region 320 of the package substrate 310 is removed to enable simultaneous optical and electrical packaging. More specifically, since the optical fiber core should be mostly aligned to the FEOL region 120, as shown and discussed with regard to FIGS. 2 and 3, the package substrate 310 can be processed to have the region 320 removed so that the optical fiber can be aligned to the FEOL region 120.

Figure 9B:
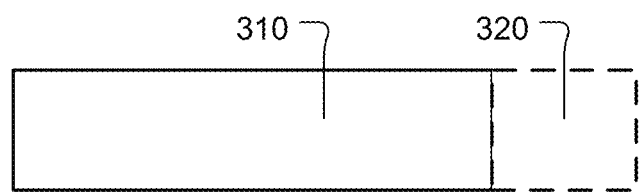
FIG. 9B shows a vertical cross-section through the package substrate corresponding to the View A-A as referenced in FIG. 9A, in accordance with some embodiments.
Figure 9C:
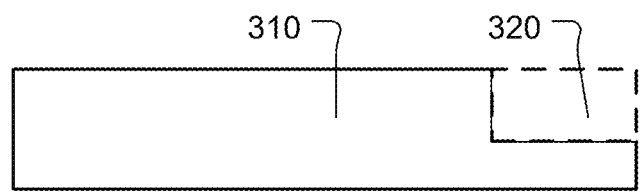
FIG. 9C shows another vertical cross-section through the package substrate corresponding to the View A-A as referenced in FIG. 9A, in accordance with some embodiments.

FIG. 9B shows a vertical cross-section through the package substrate 310 corresponding to the View A-A as referenced in FIG. 9A, in accordance with some embodiments. In the example of FIG. 9B, the removed region 320 extends through an entire vertical thickness of the package substrate 310. FIG. 9C shows another vertical cross-section through the package substrate 310 corresponding to the View A-A as referenced in FIG. 9A, in accordance with some embodiments. In the example of FIG. 9C, the removed region 320 extends through a portion of the vertical thickness of the package substrate 310 that is less than entire vertical thickness of the package substrate 310.

Figure 10A:
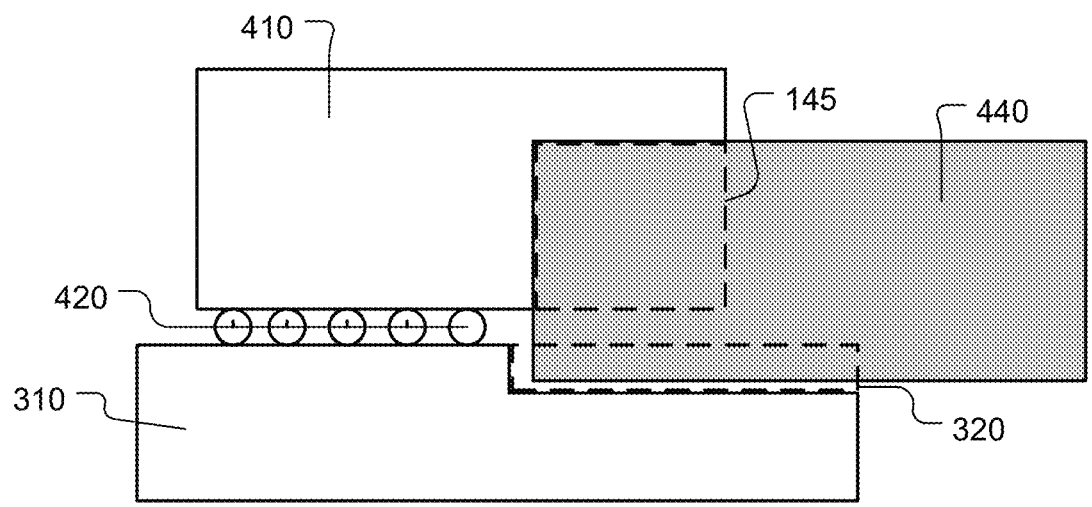
FIGS. 10A and 10B show example vertical cross-sections of electrically and optically packaged photonic chip with two different package substrate options, in accordance with some embodiments.
Figure 10B:
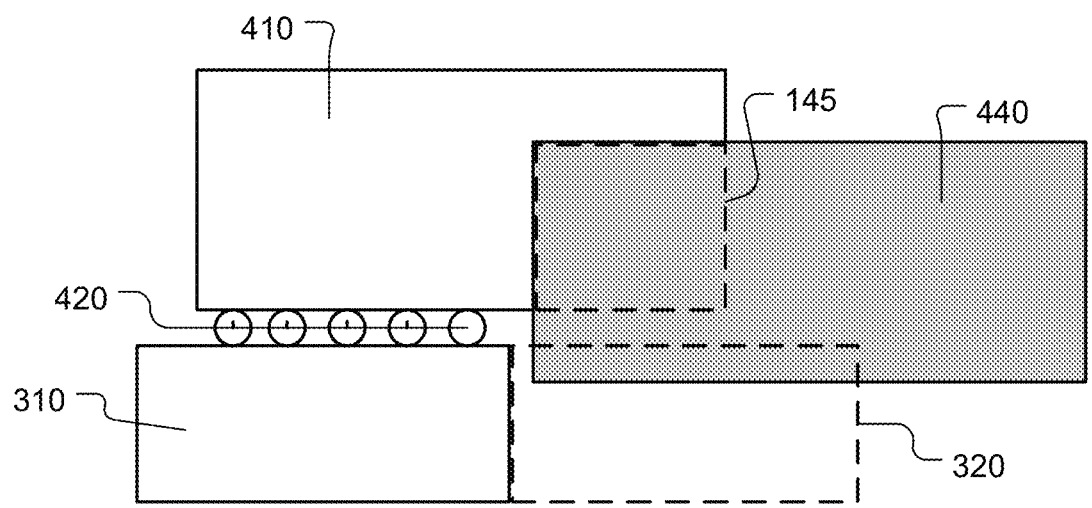

FIGS. 10A and 10B show example vertical cross-sections of electrically and optically packaged photonic chip 410 with two different package substrate 310 options, in accordance with some embodiments. FIG. 10A shows an embodiment in which the removed region 320 of the package substrate 310 forms a recess within the package substrate 310. In the example configuration of FIG. 10A, the photonic chip 410 is electrically connected to the package substrate 310 through an electrical connection 420. In various embodiments, the electrical connection 420 can be formed by C4 solder balls, copper pillars, or by essentially any other type of flip-chip bonding technique. Also, in the configuration of FIG. 10A, an optical fiber 440 is optically connected to the photonic chip 410, with the recessed region of the package substrate 310 configured to enable connection of the optical fiber 440 to the photonic chip 410. FIG. 10B shows an embodiment in which the removed region 320 of the package substrate 310 corresponds to removal of an entire vertical thickness of the package substrate 310 beneath the optical fiber 440. It should be understood that in various embodiments removal of the region 320 of the package substrate 310 can be done either by etching or cleaving processes. And, in some embodiments, the package substrate 310 can be formed so that an outer edge of the package substrate does not encroach within the region that has to be occupied by the optical fiber 440 when the optical fiber 440 is connected to the photonic chip 410.

In accordance with the foregoing, in some embodiments, a packaged photonic chip system includes the photonic chip 410, the package substrate 310 including electrical connection pads, and the electrical connection 420 disposed between the photonic chip 410 and the package substrate 310. The photonic chip 410 includes the substrate 140 and the electrical isolation region 130 formed over the substrate 140. The photonic chip 410 includes the FEOL region 120 formed over the electrical isolation region 130. The FEOL region 120 includes transistors and electro-optic devices, among other electrical device and optical structures/devices. In some embodiments, the electrical isolation region 130 is a buried oxide region. In some embodiments, the electrical isolation region 130 includes one or more of a shallow trench isolation region and a deep trench isolation region. The photonic chip 410 includes the BEOL region 110 formed over the FEOL region 120. The BEOL region 110 includes interlevel dielectric materials and metal interconnect structures, among other structures. The photonic chip 410 includes the optical coupling region 145 defined within a horizontal area extending inward from an edge of the photonic chip 410. A portion of the BEOL region 110, a portion of the FEOL region 120, a portion of the electrical isolation region 130 and a portion of the substrate 140 are removed within the optical coupling region 145 to accommodate connection of the optical fiber 440 to the photonic chip 410. In some embodiments, a top surface of a remainder of the substrate 140 within the optical coupling region 145 includes a plurality of grooves configured to receive and align a corresponding plurality of optical fibers 440. The electrical connection 420 is disposed between the photonic chip 410 and the package substrate 310. The electrical connection 420 is configured to electrically connect some of the metal interconnect structures within the BEOL region 110 to electrical connection pads of the package substrate 310. At least a portion of the package substrate 310 is removed to accommodate positioning of the plurality of optical fibers 440 within the optical coupling region 145. In some embodiments, a portion of the package substrate 310 next to the optical coupling region 145 is completely removed to accommodate positioning of the plurality of optical fibers 440 within the optical coupling region 145.

In some embodiments of the packaging architecture described herein, it is desirable to have both TE-like (transverse electric-like) and TM-like (transverse magnetic-like) optical modes in a waveguide formed within the FEOL region 120. The TE-like mode is defined as the optical mode with a dominant electric field component oriented horizontally with respect to the waveguide core. The TM-like mode is defined as the optical mode with the dominant electric field component oriented vertically with respect to the waveguide core. In some thin-SOI processes, the crystalline silicon active region is too thin to support a well-guided TM-like optical mode. Thus, it is desirable to have an additional high-index contrast material with low optical propagation loss integrated into the front-end process flow to create a thicker waveguide which results in well-guided TM-like optical modes. It should be appreciated that by supporting TE-like and TM-like optical modes, polarization diverse optical circuits can be designed.

Figure 11A:
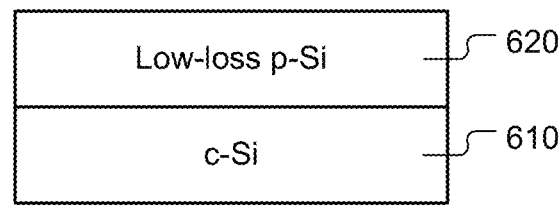
FIG. 11A shows an example material cross-section in which a low-loss polysilicon material is provided as a high-index contrast material layer over the crystalline silicon region, i.e., over the substrate, to form a waveguide within the FEOL region, in accordance with some embodiments.

FIG. 11A shows an example material cross-section in which a low-loss polysilicon material 620 is provided as a high-index contrast material layer over the crystalline silicon region 610, i.e., over the substrate 140, to form a waveguide within the FEOL region 120, in accordance with some embodiments. In some embodiments, the low-loss polysilicon material 620 has a thickness, as measured perpendicular to a top surface of the underlying crystalline silicon region 610, that is substantially equal to a thickness of gate polysilicon material used to form gate electrodes of transistor devices. However, it should be understood that in some embodiments the thickness of the low-loss polysilicon material 620 may be different than the thickness of the gate polysilicon material.

In some embodiments, the low-loss polysilicon material 620 is the same material as the gate polysilicon material. In some embodiments, the low-loss polysilicon material 620 is amorphous polysilicon, which may be different from the gate polysilicon material. Also, in some embodiments, the low-loss polysilicon material 620 can be intrinsically doped to create sufficiently low propagation loss therein. Also, to reduce surface roughness of the low-loss polysilicon material 620 (because the surface roughness increases propagation loss) a chemical mechanical polish/planarization (CMP) process can be used to planarize the low-loss polysilicon material 620. And, if the low-loss polysilicon material 620 is deposited amorphously and subsequently crystallized (e.g., exposed to temperatures greater than approximately 550° C.), the CMP process may not be required.

Figure 11B:
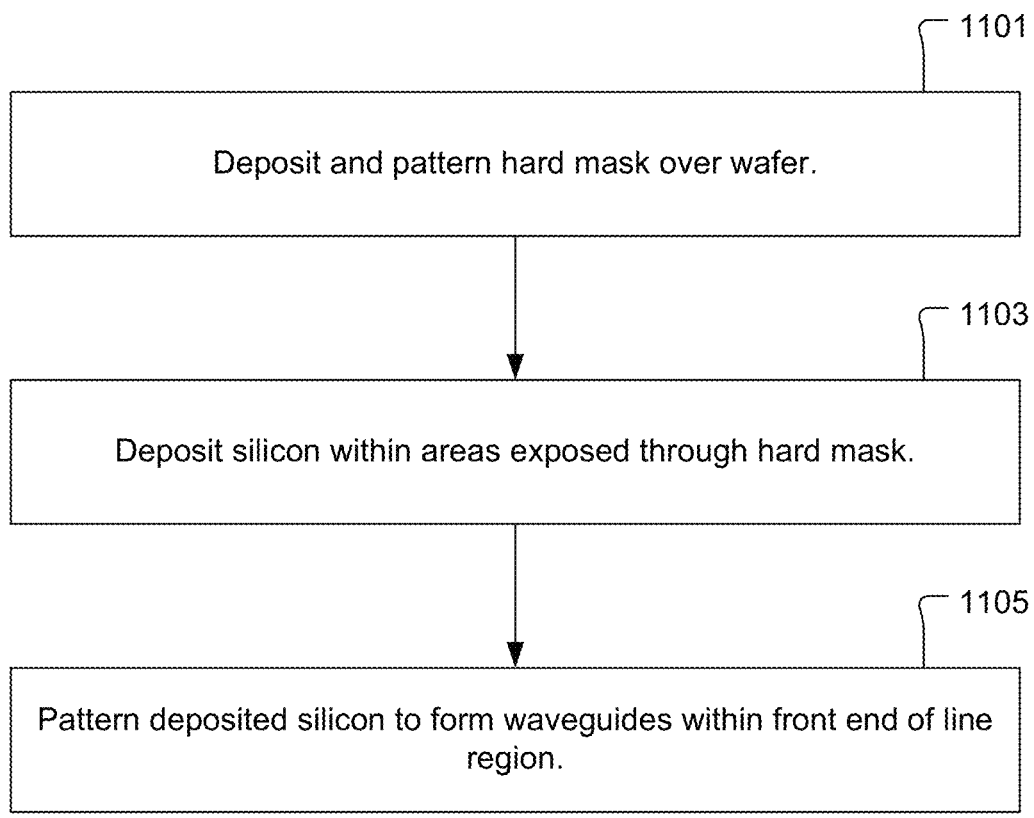
FIG. 11B shows a flowchart of a photonic chip fabrication process flow, in accordance with some embodiments.

FIG. 11B shows a flowchart of a photonic chip fabrication process flow, in accordance with some embodiments. The flowchart of FIG. 11B starts at a post gate oxidation step within the photonic chip fabrication process. The process flow includes an operation 1101 for depositing and patterning a hard mask over the wafer. In some embodiments, the hard mask is uniformly deposited as a thin film over the wafer, and subsequent lithography and etch techniques are used to expose areas where silicon is to be deposited. The process flow also includes an operation 1103 for depositing silicon within areas exposed through the hard mask. In some embodiments, the silicon deposited in operation 1103 is amorphous silicon. In some embodiments, amorphous silicon is deposited as a silicon film at a temperature below 530° C. In some embodiments, the silicon deposited in operation 1103 is in a polycrystalline form and is subsequently amorphized via ion implantation (typically with a dose of greater than $1 \times 10^{15}$ atoms/cm$^2$). The process flow also includes an operation 1105 for patterning the deposited silicon to form optical waveguides within the FEOL region 120. In some embodiments, lithography and etch techniques are used to pattern the silicon film, including but not limited to full and/or partial film thickness etching. In various embodiments, lithography and implant processes can be performed prior to or after device patterning on the wafer. Also, in various embodiments, the hard mask can be used as an etch stop in regions outside of the areas where optical waveguides are to be formed.

Figure 12A:
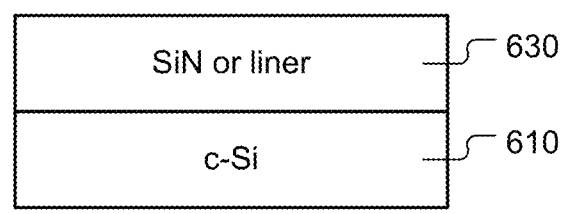
FIG. 12A shows an example material cross-section in which a silicon nitride (SiN) layer is provided as a high-index contrast material layer over the crystalline silicon region, i.e., over the substrate, to form a waveguide within the FEOL region, in accordance with some embodiments.

FIG. 12A shows an example material cross-section in which a silicon nitride (SiN) layer 630 is provided as a high-index contrast material layer over the crystalline silicon region 610, i.e., over the substrate 140, to form a waveguide within the FEOL region 120, in accordance with some embodiments. It should be appreciated that SiN is compatible with and present in most advanced CMOS processes. In some embodiments, the SiN layer 630 can be an independent addition to the fabrication process.

Figure 12B:
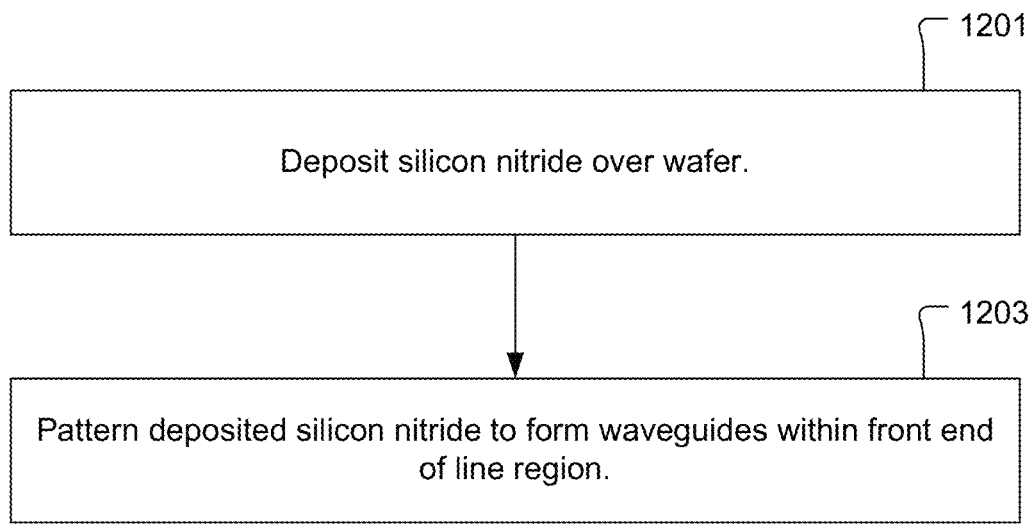
FIG. 12B shows a flowchart of a photonic chip fabrication process flow, in accordance with some embodiments.

FIG. 12B shows a flowchart of a photonic chip fabrication process flow, in accordance with some embodiments. The flowchart of FIG. 12B starts at a post gate oxidation step within the photonic chip fabrication process. The process flow includes an operation 1201 for depositing silicon nitride over the wafer. In some embodiments, operation 1201 includes LP-CVD (low-pressure chemical vapor deposition) of silicon nitride approximately uniformly over the wafer. In some embodiments, a silicon dioxide film of at least 50 angstroms is grown or deposited over the underlying crystalline-silicon (c-Si) material (substrate/film) prior to deposition of the silicon nitride in operation 1201. The process flow also includes an operation 1203 for patterning the silicon nitride film to form desired optical waveguides. In some embodiments, lithography and etch techniques are used to pattern the silicon nitride, including but not limited to full and/or partial film thickness etching.

Figure 13A:
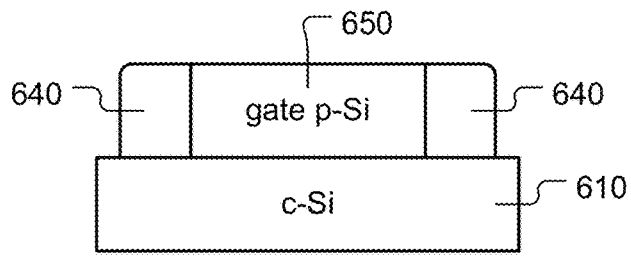
FIG. 13A shows an example material cross-section in which a silicon nitride (SiN) liner is utilized as a high-index contrast material layer over the crystalline silicon region, i.e., over the substrate, to form a waveguide within the FEOL region, in accordance with some embodiments.

FIG. 13A shows an example material cross-section in which a silicon nitride (SiN) liner 640 is utilized as a high-index contrast material layer over the crystalline silicon region 610, i.e., over the substrate 140, to form a waveguide within the FEOL region 120, in accordance with some embodiments. In some embodiments, the SiN liner 640 material may already be present in the transistor-level architecture of the semiconductor device, and can be manipulated for use as the high-index contrast material. For example, in some embodiments, the SiN liner 640 material that is conformally defined along the polysilicon transistor gate material 650 can be used as the high-index contrast material. For example, in some embodiments, a lightly doped SiN material used for drain "spacers" in the transistor design can also be used as the high-index contrast material.

Figure 13B:
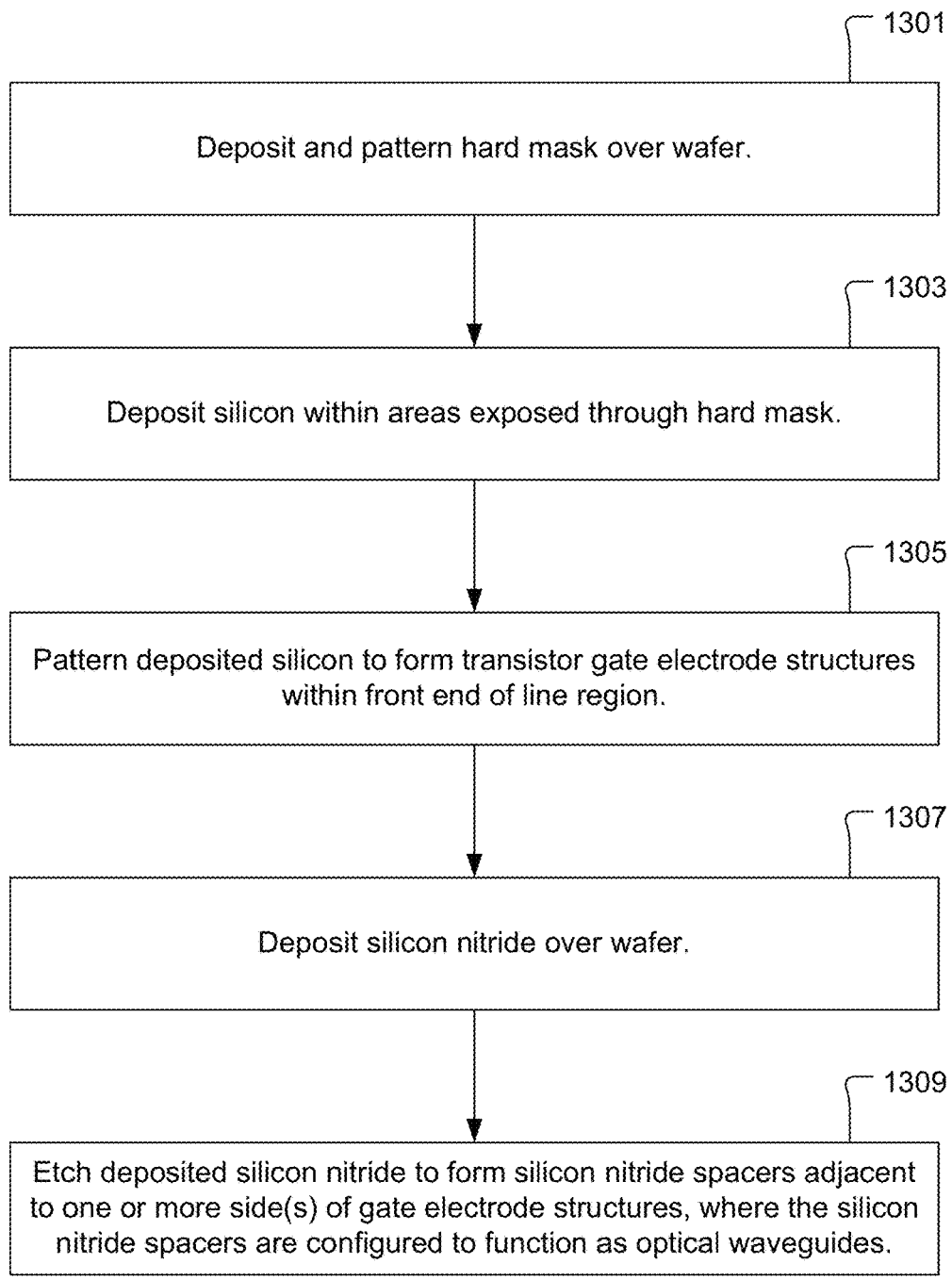
FIG. 13B shows a flowchart of a photonic chip fabrication process flow, in accordance with some embodiments.

FIG. 13B shows a flowchart of a photonic chip fabrication process flow, in accordance with some embodiments. The flowchart of FIG. 13B starts at a post gate oxidation step within the photonic chip fabrication process. The process flow includes an operation 1301 for depositing and patterning a hard mask over the wafer. In some embodiments, the hard mask is uniformly deposited as a thin film over the wafer, and subsequent lithography and etch techniques are used to expose areas where silicon is to be deposited. The process flow also includes an operation 1303 for depositing silicon within areas exposed through the hard mask. In some embodiments, the silicon deposited in operation 1303 is amorphous silicon. In some embodiments, amorphous silicon is deposited as a silicon film at a temperature below 530° C. In some embodiments, the silicon deposited in operation 1303 is in a polycrystalline form and is subsequently amorphized via ion implantation (typically with a dose of greater than $1 \times 10^{15}$ atoms/cm$^2$). The process flow also includes an operation 1305 for patterning the deposited silicon to form transistor gate electrode structures within the FEOL region 120. In some embodiments, lithography and etch techniques are used to pattern the silicon film, including but not limited to full and/or partial film thickness etching. In various embodiments, lithography and implant processes can be performed prior to or after device patterning on the wafer. Also, in various embodiments, the hard mask can be used as an etch stop in regions outside of the areas where optical waveguides are to be formed. The process flow also includes an operation 1307 for depositing an approximately uniform layer of silicon nitride over the wafer. In some embodiments, operation 1307 includes LP-CVD (low-pressure chemical vapor deposition) of silicon nitride approximately uniformly over the wafer. The process flow also includes an operation 1309 for etching the deposited silicon nitride to form silicon nitride spacers adjacent to one or more side(s) of gate electrode structures (polysilicon gate electrode structures), so that the silicon nitride spacers are configured to function as optical waveguides. In some embodiments, the etching of operation 1309 is done without use of a lithographic mask. In some embodiments, the etching of operation 1309 includes use of a lithographic mask. If a lithographic mask is used in the operation 1309, asymmetric silicon nitride spacers can be grown (e.g., silicon nitride spacers on one side or the other side of a given gate electrode structure, but not on both sides of the given gate electrode structure).

The examples embodiments described with regard to FIGS. 11A, 11B, 12A, 12B, 13A, and 13C outline the insertion of a polysilicon and/or SiN feature(s) into a semiconductor process flow as the high-index contrast material. It should be understood that the low-loss polysilicon (referred to as p-Si) or SiN or liner material can be inserted at various steps in the semiconductor fabrication process. Therefore, it should be understood that the semiconductor fabrication process flow descriptions provided with regard to FIGS. 11A, 11B, 12A, 12B, 13A, and 13C are provided by way of example and are not intended to be inclusive of all possible ways in which the techniques disclosed herein can be implemented in semiconductor device fabrication.

Figure 14:
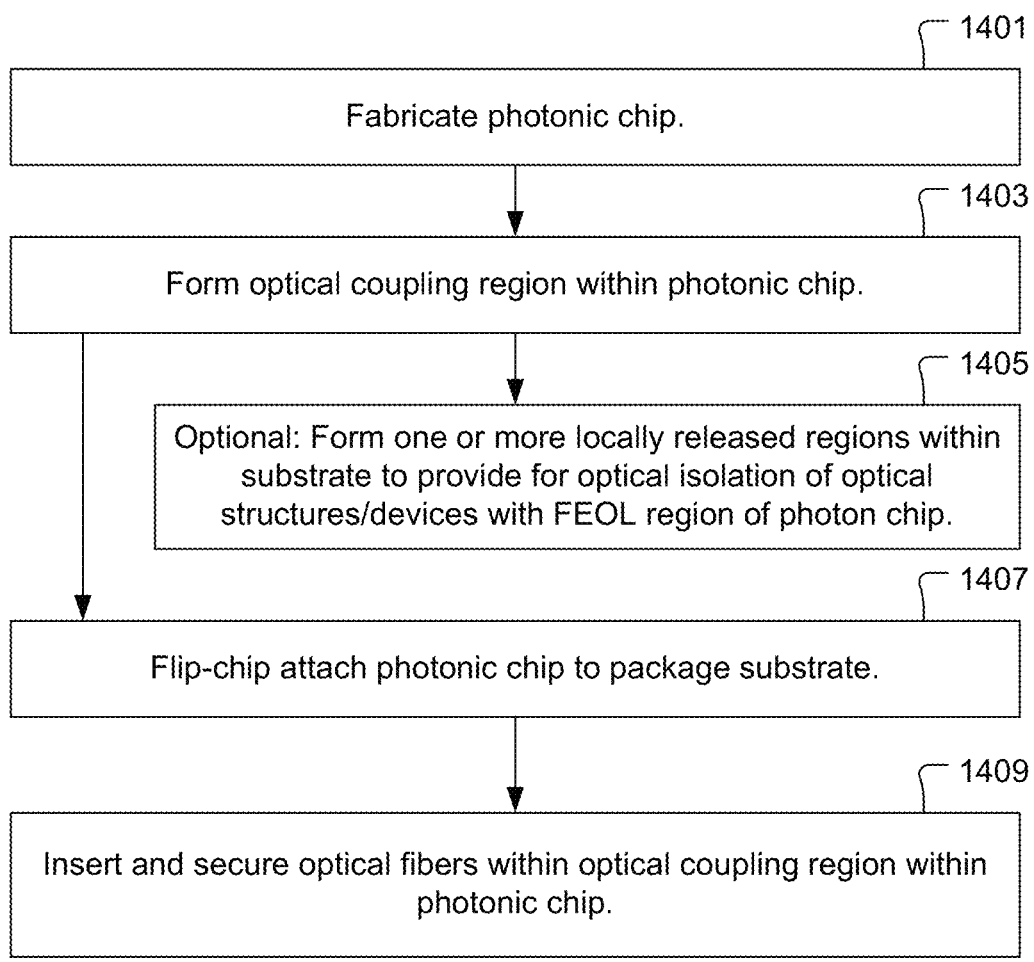
FIG. 14 shows a flowchart of an example process flow, in accordance with some embodiments.

FIG. 14 shows a flowchart of an example process flow, in accordance with some embodiments. The process flow includes an operation 1401 in which a photonic chip is fabricated. The photonic chip can be of essentially any type, including but not limited to silicon, InP, GaAs, InGaAsP, among others. The process flow also includes an operation 1403 in which an optical coupling region 145 is formed within the photonic chip. In some embodiments, the operation 1403 includes forming a mask aligned to optical circuits on the chip, using either photoresist or a hard mask. The operation 1403 also includes etching in areas exposed through the mask to remove portions of the BEOL region 110, the FEOL region 120, the electrical isolation region 130, and some of the substrate 140 within the optical coupling region 145. In some embodiments, V-grooves 170 are formed in the substrate 140 within the optical coupling region 145. In various embodiments, the etching to form the optical coupling region 145 can include one or more of a Reactive Ion Etch (RIE), a tetramethyl ammonium hydroxide (TMAH) etch, a potassium hydroxide (KOH) etch, and/or any combination of wet and dry etches. In some embodiments, in order to control the within wafer variation, stop layers can be used to improve etch variation. For example, the electrical isolation region 130 can be used as an etch stop prior to the substrate 140 etch, thus improving the vertical alignment of the optical fiber 301 to the optical circuits within the FEOL region 120.

The process flow can optionally include an operation 1405 to form one or more locally released regions within the substrate 140 to provide optically isolation of optical structures/devices within the FEOL region 120. In some embodiments, the operation 1405 is performed to implement the locally released region 190 formation process described with regard to FIG. 4. More specifically, in some embodiments, the operation 1405 can include formation of the plurality of holes 180 through the BEOL region 110, the FEOL region 120, the electrical isolation region 130, and a portion of the substrate 140 to form the locally released region 190 within the substrate. The locally released region 190 undercuts optical devices/structures within the FEOL region 120 to provide optical isolation for those optical devices/structures.

In some embodiments, the operation 1405 is performed to implement the locally released region 210 formation process described with regard to FIGS. 5 and 6. More specifically, in some embodiments, the operation 1405 can include etching through the substrate 140 from the backside of the photonic chip to form the locally released region(s) 210. In these embodiments, wafer processing techniques can be used to align a mask to the backside of the wafer. Examples of wafer processing techniques that can be used to align a mask to the backside of the wafer are described in U.S. patent application Ser. No. 15/646,039, filed on Jul. 10, 2017, entitled "Wafer-Level Etching Methods for Planar Photonics Circuits and Devices," which is incorporated herein by reference in its entirety for all purposes.

The process flow also includes an operation 1407 in which the photonic chip is flip-chip attached to a package substrate (or "fan-out" substrate), such as discussed with regard to FIGS. 9A, 9B, 9C, 10A, 10B. In various embodiments, a material of the package substrate can be one or more of Bismaleimide-Triazine (BT) resin, Low Temperature Co-fired Ceramic (LTCC), High Temperature Co-fired Ceramic (HTCC), alumina, aluminum nitride, or any other material used in electronic packaging. In various embodiments, the photonic chip can be bonded to the package substrate using one or more of the following processes: mass reflow, thermo-compression bonding, thermosonic bonding, or any of the various bonding techniques used in electronic packaging. In some embodiments, underfill material is applied between the photonic chip and the package substrate using either Capillary Under-Fill (CUF) or Non-Conductive Fill (NCF).

The process flow also includes an operation 1409 in which optical fibers are inserted and secured within the optical coupling region 145 formed within the photonic chip. In some embodiments, such as disclosed with regard to FIG. 10A, the package substrate is partially removed at the location adjacent to the optical coupling region 145, so as to form a cavity between the photonic chip and the package substrate within which the optical fibers are to be inserted. In these embodiments, the optical fibers are inserted in the cavity between the photonic chip and the package substrate in the horizontal (x) direction along the axis of the optical fibers. V-grooves 170 formed in the substrate 140 of the photonic chip guide and align the optical fibers as they are inserted into the cavity between the photonic chip and the package substrate.

In some embodiments, such as disclosed with regard to FIG. 10B, the package substrate is completely removed (or not present to begin with) at the location adjacent to the optical coupling region 145 where optical fibers are to be attached. In these embodiments, the optical fibers can be inserted into the optical coupling region 145 in a direction lateral (perpendicular) to the axes of the optical fibers, i.e., in a direction lateral (perpendicular) to the horizontal direction x. V-grooves 170 formed in the substrate 140 of the photonic chip guide and align the optical fibers as they are inserted into the optical coupling region 145 in the direction lateral (perpendicular) to the axes of the optical fibers.

In some embodiments, prior to inserting the optical fibers into the optical coupling region 145, epoxy or another adhesive is applied to the photonic chip/package substrate assembly to secure the optical fibers. In some embodiments, prior to inserting the optical fibers into the optical coupling region 145, epoxy or another adhesive can be applied to the optical fiber to secure the optical fibers. When the optical fibers are inserted into the optical coupling region 145, if the epoxy or adhesive is in the optical path, the epoxy or adhesive can be index matched to the optical fiber to reduce return light loss. Also, in various embodiments, epoxies or other types of adhesive used to secure the optical fibers can be cured by a thermal cure (including room temperature cure) and/or by an ultraviolet (UV) cure. Example epoxies/adhesives include Norland Optical Adhesive 86H, Epo-Tek OG142-87, and Epo-Tek OG198-54, among others.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in other embodiments, even if not specifically shown or described. Such variations of the example embodiments disclosed herein are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the invention description. Accordingly, the example embodiments disclosed herein are to be considered as illustrative and not restrictive, and the invention is not to be limited to the details given herein, but may be modified within the scope and equivalents of the described embodiments.

What is claimed is:

1. A photonic chip, comprising:
    a substrate;
    a front end of line region formed over the substrate, the front end of line region including transistors and electro-optic devices; and
    an optical coupling region formed to receive a plurality of optical fibers, wherein the front end of line region is removed within the optical coupling region, wherein the optical coupling region provides for alignment of optical cores of the plurality of optical fibers with the front end of line region when the plurality of optical fibers are positioned within the optical coupling region.

2. The photonic chip as recited in claim 1, further comprising:
    a buried oxide region disposed between the substrate and the front end of line region.

3. The photonic chip as recited in claim 2, wherein the buried oxide region is removed within the optical coupling region.

4. The photonic chip as recited in claim 1, further comprising:
    a shallow trench isolation region disposed between the substrate and the front end of line region.

5. The photonic chip as recited in claim 4, wherein the shallow trench isolation region is removed within the optical coupling region.

6. The photonic chip as recited in claim 1, further comprising:
    a deep trench isolation region disposed between the substrate and the front end of line region.

7. The photonic chip as recited in claim 6, wherein the deep trench isolation region is removed within the optical coupling region.

8. The photonic chip as recited in claim 1, wherein the optical coupling region includes alignment structures for aligning the optical cores of the plurality of optical fibers with the front end of line region.

9. The photonic chip as recited in claim 1, wherein the alignment structures include a plurality of recessed regions that extend across the optical coupling region in a substantially parallel manner.

10. The photonic chip as recited in claim 1, wherein the optical coupling region provides for alignment of optical cores of the plurality of optical fibers with a respective plurality of optical waveguides within the front end of line region.

11. The photonic chip as recited in claim 1, wherein the optical coupling region provides for alignment of optical cores of the plurality of optical fibers with a respective plurality of optical grating couplers within the front end of line region.

12. The photonic chip as recited in claim 1, further comprising:
    a back end of line region formed over the front end of line region, the back end of line region removed within the optical coupling region, the back end of line region including metal interconnect structures.

13. The photonic chip as recited in claim 1, further comprising:
    an optical isolating material disposed between the substrate and the front end of line region.

14. A photonic chip, comprising:
    a substrate, wherein a portion of the substrate is removed to form an optical coupling region, the optical coupling region formed to receive a plurality of optical fibers; and
    a front end of line region formed over the substrate, the front end of line region including transistors and electro-optic devices, the front end of line region including a plurality of optical grating couplers positioned to optically couple with respective optical cores of the plurality of optical fibers through a corresponding optical turning mechanism.

15. The photonic chip as recited in claim 14, wherein the substrate at an edge of the optical coupling region provides a stop barrier for the plurality of optical fibers.

16. The photonic chip as recited in claim 14, further comprising:
    an electrical isolation region disposed between the substrate and the front end of line region, wherein openings exist in the electrical isolation region to enable light transmission between the plurality of optical grating couplers and the plurality of optical fibers.

17. The photonic chip as recited in claim 16, wherein the electrical isolation region is either one or more of a buried oxide region, a shallow trench isolation region, and a deep trench isolation region.

18. The photonic chip as recited in claim 14, wherein the optical coupling region includes alignment structures for aligning the optical cores of the plurality of optical fibers as needed to optically couple the optical grating couplers with respective optical cores of the plurality of optical fibers through the corresponding optical turning mechanism.

19. The photonic chip as recited in claim 14, wherein a depth of the portion of the substrate that is removed to form the optical coupling region is greater than an outer diameter of any of the plurality of optical fibers, wherein the depth of the portion of the substrate that is removed to form the optical coupling region is measured perpendicular to a bottom surface of the substrate.

20. The photonic chip as recited in claim 14, further comprising:

a back end of line region formed over the front end of line region, the back end of line region including metal interconnect structures.

\* \* \* \* \*